United States Patent [19]

Andrieux et al.

[11] Patent Number: 4,692,841

[45] Date of Patent: Sep. 8, 1987

[54] ELECTRONIC MODULE THAT CAN BE PLUGGED INTO A BUS CONNECTOR

[75] Inventors: Alain Andrieux, Lessarts; Yves Trequilly, Meudon; Jean-Claude Lavoine, Montrouge, all of France

[73] Assignee: CGEE Alsthom Direction Red, Societe Anonyme, Clamart, France

[21] Appl. No.: 846,002

[22] Filed: Mar. 31, 1986

[30] Foreign Application Priority Data

Apr. 2, 1985 [FR] France ................................ 85 04978

[51] Int. Cl.[4] ................................................ H05K 1/14

[52] U.S. Cl. ..................................................... 361/395

[58] Field of Search ............... 361/395, 390, 391, 392, 361/394, 397

[56] References Cited

U.S. PATENT DOCUMENTS

| | | | |
|---|---|---|---|
| 4,131,934 | 12/1978 | Becker et al. | 361/395 |
| 4,247,882 | 1/1981 | Prager et al. | 361/395 |

FOREIGN PATENT DOCUMENTS

| | | |
|---|---|---|
| 0067757 | 12/1982 | European Pat. Off. . |
| 2009516 | 2/1970 | France . |
| 2269273 | 11/1975 | France . |

*Primary Examiner*—Roy N. Envall, Jr.

*Attorney, Agent, or Firm*—Oblon, Fisher, Spivak, McClelland, & Maier

[57] ABSTRACT

The invention relates to an electronic module that can be plugged into a bus connector.

Bus connector (2) is solid with a base support (3); module (1) comprises at least a printed circuit board (4), placed in a housing (5) that can fit the base (3), a means (6) for connecting the board to the bus connector (2), and an auxiliary connector (8) to connect the circuit of board (4) to an outside wiring. Base support (3) of bus connector (2) is a U-shaped elongated element, bus connector (2) comprises parallel conductive strips insulated from one another and insulated from the base, located at the bottom of the U of the shaped element, the two wings of the U each comprising, toward the inside of the U, a groove (16, 17) parallel to the bottom of the U. Housing (5) comprises means (17, 18, 23, 26) engaging in each groove (16, 17) to make this housing (5) and the support base (3) solid.

Application to pluggng in of printed circuit boards.

4 Claims, 2 Drawing Figures

ELECTRONIC MODULE THAT CAN BE PLUGGED INTO A BUS CONNECTOR

Figure 1:
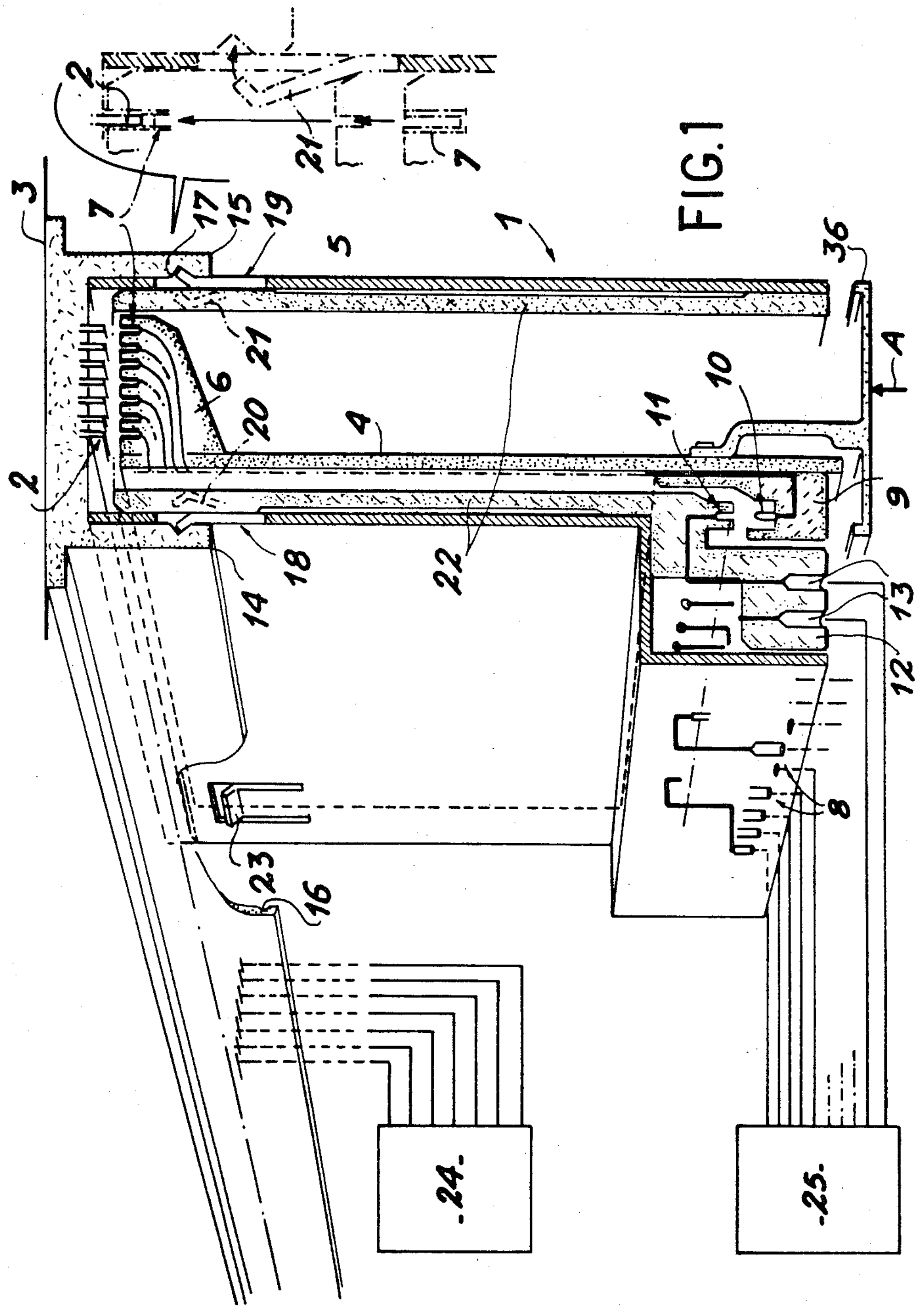

This invention relates to an electronic module that can be plugged into a bus connector. This invention applies to the fast interconnection of electronic modules, and to the interconnection of these modules with outside circuits or apparatus.

An electronic module that can be plugged into a solid bus connector of a support base is known; this known module comprises at least a printed circuit board equipped with electric and/or electronic components, placed in a housing that can fit the support base. This electronic module also comprises a means for connecting the board to the bus connector, and an auxiliary connector to connect the circuit of the board to an apparatus or circuit by an outside wiring. An electronic module of this type is described, for example, in French Pat. No. 2 507 395. In this known module, the housing containing the printed circuit board is made up of two separable parts which are assembled during electrical connecting of the board to the auxiliary connector. The bus connector is quite simply made up of a connecting strip solid with the support base, while the means for connecting the board to the bus connector consists of another connecting strip which is assembled with that of the bus connector.

In this type of plug-in module, the bus connector, made up of a connection strip, occupies a stationary position on the support. Consequently, the plug-in module or modules which it is desired to connect to the bus definitively occupy predetermined positions in relation to the support base. This is a serious drawback since the locations of the strips of the bus connector on the base support depend, of course, on the dimensions of the modules to be connected to the bus. As a result in an assembly including several modules of predetermined dimensions, it is consequently difficult to replace one of the modules with a module of different dimensions, since the locations of the strips of the bus connector have been chosen precisely as a function of the predetermined dimensions of the modules constituting the original assembly.

The invention aims at remedying these drawbacks and particularly at achieving an electronic module that can be plugged into a bus connector thanks to which it is possible, very simply and very quickly, to change one or more modules of predetermined dimensions, plugged into the bus connector, for one or more other modules of different dimensions, without the arrangement of the bus connectors making this change impossible. These aims are attained thanks to the use of a bus connector comprising parallel conductive strips located on the inside of a U-shaped elongated element, to which are fastened very quickly the housings containing the printed circuit boards and constituting the modules.

The invention has as its object an electronic module able to be plugged into a bus connector solid with a base support. These electronic modules consisting of:

at least a printed circuit board, equipped with electric and/or electronic components, this board being placed in a housing that can fit the base, an auxiliary connector to connect the circuit of the board with an outside wiring, a means for connecting the board to the bus connector.

The bus connector consists of:

a bus connector comprising parallel conductive strips insulated from one another and insulated from the base, located at the bottom of the U of the shaped element, a base support of the bus connector formed by a U-shaped elongated element, the two wings of the U each comprising, toward the inside of the U, a groove parallel to the bottom of the U.

The housing comprises means engaging in each groove to make this housing and the bus support base solid.

According to another characteristic, the means making the housing and support unit solid are elastic tongues solid with the housing and shaped to engage in each of said grooves.

According to another characteristic, the module further comprises means to support and guide the board in the housing, these means themselves being guided and supported by the housing and spreading said tongues so that they engage in the grooves.

According to another characteristic, the means for connecting the board to the bus connector is a strip of connectors acting by pinching conductive strips of the bus.

Figure 2:
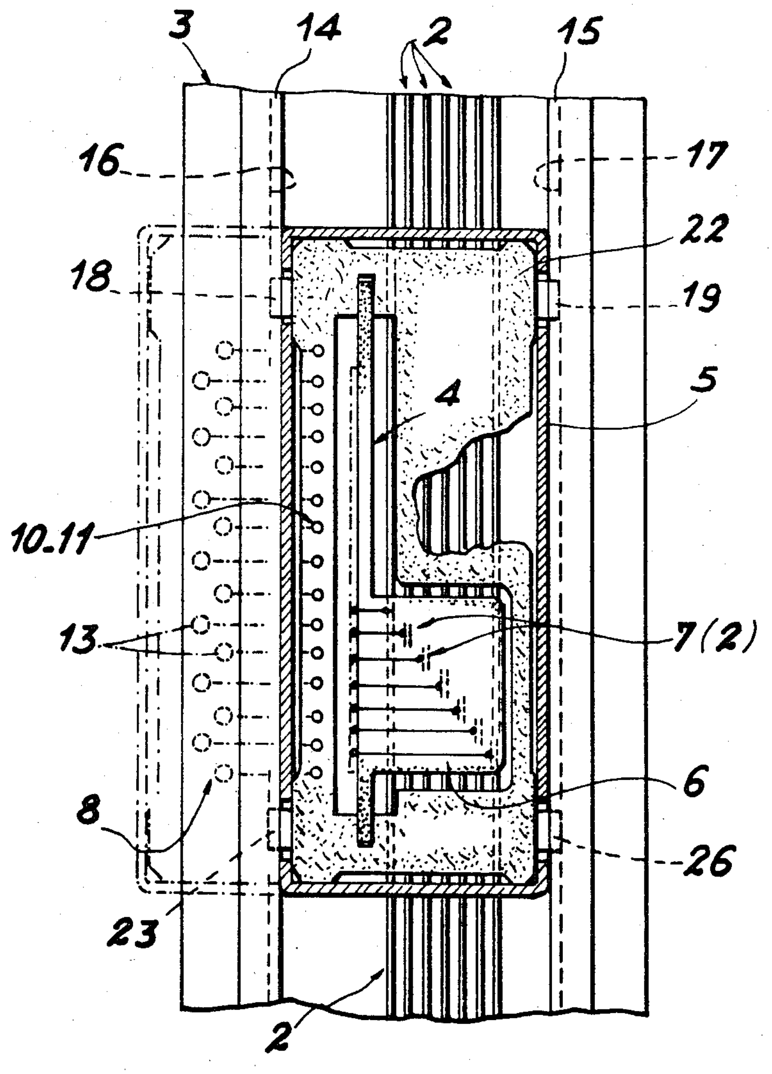

The characteristics and advantages of the invention will come out better from the following description given with reference to the accompanying drawings in which:

FIG. 1 diagrammatically represents in perspective an electronic module plugged into a bus connector, according to the invention, FIG. 2 is a diagrammatic front view of the housing containing the printed circuit board, this board being connected to the bus connector.

FIG. 1 diagrammatically represents in perspective an electronic module 1 according to the invention, that can be plugged into bus connector 2, solid with a support base 3. This electronic module comprises at least a printed circuit board 4, equipped with electronic and/or electric components, which are not shown in detail on the figure. This board is housed in a housing 5, of metal for example, which fits support base 3 as will be seen in detail below. This module also comprises a means 6 making it possible to connect the circuit of board 4 to bus connector 2. This means 6 can be, for example, a strip of connectors 7, acting by pinching of bus connector 2 consisting of parallel conductive strips, insulated from one another and insulated from support base 3. The insulating means are not shown in detail on this figure. Finally, this module comprises an auxiliary connector 8 to connect the circuit of board 4 to an outside wiring which is not represented in this figure. This auxiliary connector 8 can consist, for example, of a connection strip 9 with male type plugs 10 that cooperate with female type plugs 11 of another strip 12. Strip 9 is solid with board 4, while strip 12 is solid, for example, with housing 5 or a drawer 22 which will be described below. Plugs 11 of strip 12 are connected to female type plugs 13 making it possible to connect the circuit of board 4 to an outside wiring, which is not shown in the figure.

Support base 3 of bus connector 2 is a U-shaped elongated element. Parallel conductive strips 2 of the bus connector are located at the bottom of the U of this shaped element. The two wings 14, 15, of shaped element 3, each comprise toward the inside of the U a groove that is parallel to the bottom of this shaped element. These grooves are represented as 16, 17 in the figure. Housing 1 comprises means engaging in grooves 16, 17 to make this housing solid with bus support base 3. Here, these means consist of elastic tongues 18, 19 which are shaped to engage in each of the corresponding grooves. At rest, these tongues are retracted, on the inside of the housing, as shown at 20, 21, and on the enlarged part of FIG. 1. These tongues are thrust out, during placing of the module by means 22 acting as a drawer containing board 4. These means 22 are guided and supported by housing 5 and, when they are engaged in this housing, spread tongues 18, 19 so that they take a place in grooves 16, 17. Means 22 which slide in housing 5 make it possible to support and guide board 4, as will be seen below. One of the tongues is represented in a more detailed way as 23. Means 22 which act as a drawer sliding in housing 5 and which contain board 4 can consist, for example, of an insulating material.

The conductive strips of bus connector 2 make it possible to connect the module, which is represented in the figure, to other modules, or to electric or electronic means 24 which make it possible, for example, to supply these modules with electric power or to send data signals to these modules, or again to receive data signals coming from these modules. This figure also shows electric and/or electronic means 25 exchanging signals with module 1 by auxiliary connector 8. It is assured in this figure that a cover 36 which is not shown in detail in the figure is solid with housing 5. This cover closes housing 5. In the figure, the module is shown in a position that is not completely plugged in. Plugging of parts 7 into parts 2 is performed by exerting a push on cover 36 along arrow A.

FIG. 2 diagrammatically represents a front view of module 1, along arrow A of FIG. 1, cover 36 being assumed removed. The same elements carry the same references in this figure and in FIG. 1. This figure shows auxiliary connector 8 which makes it possible to connect board 5 to an outside wiring, as well as connection means 6 of the board to the conductive strips of bus connector 2, these strips being solid and insulated from support base 3; there are also shown grooves 16, 17 in which elastic tongues 18, 19, 23, 26 of housing 5 engage, when drawer 22, supporting and guiding board 4, is put in place in the housing.

The various modules are mounted against one another, along the support base. This figure also shows female type plugs 13 making it possible to connect board 4 to an outside wiring.

The module that has just been described makes it possible to attain the aims mentioned above. It particularly makes it possible to connect to a bus connector modules exhibiting different dimensions or to change certain modules in a module assembly very simply since each module can travel in support base 2 to occupy any position along the bus connector.

We claim:

1. A connecting unit comprising:

a U-shaped support base, a bus connector locked with the support base and adapted to be electrically connected to a bus, an electric module plugged into the bus connector, said module comprising a housing engaged in the support base and containing a printed circuit board having mounted thereon electric components, an auxiliary connector connected to the circuit board and adapted to connect the circuit board to outside wiring, said support base being a U-shaped elongated element defined by a bottom portion integrally connected to opposed wings extending from opposite sides of the bottom portion, said bus connector comprising parallel conductive strips insulated from one another and insulated from the support base, said parallel conductive strips located at the bottom portion of the U-shaped support base, the two wings of the support base each having opposed grooves facing each other parallel to the bottom of the U-shaped portion, and said housing comprising locking means for engaging the grooves of the opposed wings of the U-shaped base so that the housing and support base are locked together.

2. Unit according to claim 1, wherein the locking means comprises elastic tongues integrally connected to the housing and shaped to engage respective of said grooves.

3. Unit according to claim 2, further comprising means to support and guide the circuit board in said housing, said means themselves being guided and supported by the housing and spreading said tongues so as to engage in respective of said grooves.

4. Unit according to any of claims 1, 2 or 3, wherein the means for connecting the board to the bus connector comprises a strip of connectors acting by pinching conductive strips of the bus.

* * * * *